United States Patent [19]

Paratte

[11] 4,276,630
[45] Jun. 30, 1981

[54] ELECTRONIC WATCH MOVEMENT

[75] Inventor: Daniel Paratte, Neuchâtel, Switzerland

[73] Assignee: Fabrique d'Horlogerie de Fontainemelon S.A., Neuchâtel, Switzerland

[21] Appl. No.: 969,187

[22] Filed: Dec. 13, 1978

[30] Foreign Application Priority Data

Dec. 14, 1977 [CH] Switzerland ............... 15379/77

[51] Int. Cl.³ ............................................. G04C 23/02
[52] U.S. Cl. .................................... 368/88; 29/177
[58] Field of Search ..................... 58/23 R, 50 R; 228/180 A; 29/627, 628, 177, 625; 174/52 FP; 368/88, 155–157

[56] References Cited

U.S. PATENT DOCUMENTS

| 3,480,836 | 11/1969 | Aronstein | 29/627 X |
| 4,058,970 | 11/1977 | Ichinose | 58/50 R X |
| 4,164,843 | 8/1979 | Fujimori | 58/23 R |

Primary Examiner—Francis S. Husar
Assistant Examiner—C. J. Arbes
Attorney, Agent, or Firm—Silverman, Cass & Singer, Ltd.

[57] ABSTRACT

An electronic watch movement is formed from a flexible substrate which is enabled to fit the relief of the watch movement frame by openings formed therein. A conductive metal coating is affixed on the substrate covering the openings, and portions of the coating are removed to form an electric conductor grid with some coating sections left over some openings. The coating support the substrate between the openings and mount the substrate in the frame by bending so that the coating supports sections to conform to the frame relief.

2 Claims, 11 Drawing Figures

ELECTRONIC WATCH MOVEMENT

The present invention relates to a method for manufacturing an electronic watch movement. It relates also to the electronic watch movement obtained by carrying out this method.

The electronic modules presently used in the watchmaking have a rigid substrate to which one gives a relief which is the reverse of the relief of the frame of the movement, that is to say the base-plate, in such a way that the said module can be applied correctly on the said frame. Hence, the components of the module are not situated all at the same level and it is necessary, so that the electric connectors of the components can reach the net or grid of the electric connectors of the substrate of the module, to bend the connectors of the components.

The purpose of the present invention is to remedy the drawbacks of the known arrangements while supplying an electronic module which is flexible and deformable, in such a way as to permit it to be adapted to the relief of the frame of the watch movement with which this module is used.

The method of manufacturing according to the invention is characterized by the fact that one provides in the substrate of the electronic module of the said movement solutions of continuity (separations, interruptions or openings), affixes on the said substrate a conductive metallic coating covering the said solutions of continuity, eliminates the said metallic coating where its presence is not desired, thus realizing the net or grid of the electric conductors of the module, while letting it to remain opposite the said solutions of continuity of the substrate, where it ensures alone the connection between the elements of the substrate separated by the said solutions of continuity, in such a way that the module be able, opposite these solutions of continuity, to be deformed by the bending of the metallic coating, and places the module on the frame of the movement of the watch, while bending it in such a way as to oblige it to adapt itself to the relief of the said frame.

The watch movement according to the invention is characterized by the fact that its electronic module is deformable and is adapted to the relief of the frame of the movement.

The drawing shows, by way of example, one mode of carrying out the method according to the invention.

Figure 1:
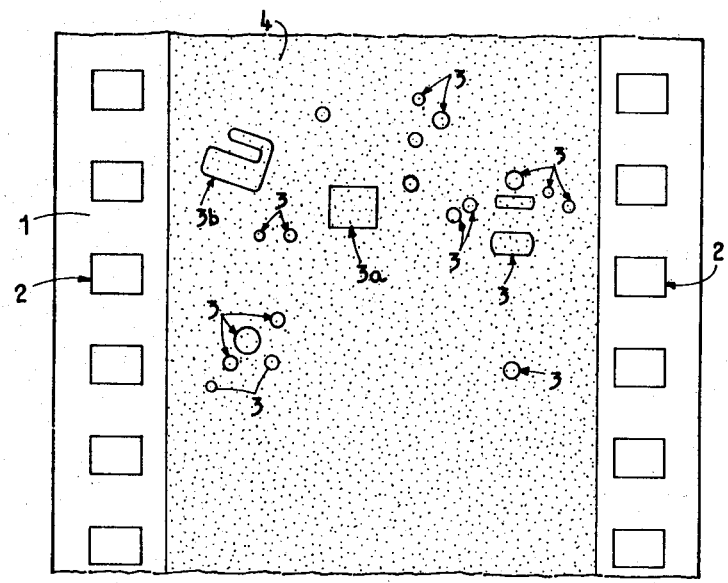
FIGS. 1 to 4 are plan views of a portion of a flexible film in four different stages of the process of manufacturing of the modules.

According to the present method, one uses a film 1 made of plastic material, which is flexible and thin, its thickness being of the order of 50 to 125 microns, provided laterally with two sets of perforations 2, like a cinematographic film, permitting to produce its advance, step by step, during the work, by means of toothed wheels of the installation, the teeth of which engage the said perforations. The teeth and perforations permit the precise determination of the position of the film in the different working stations of the machine or machines serving to manufacture, in a continuous process, the modules.

One provides in the film 1 holes or openings 3, by cutting-stamping or chemically, for instance, of which a part at least are situated opposite places where the finished module must comprise the weldings connecting its components to electric connectors.

The holes or openings 3a form the solutions of continuity in the film. It is to be noted that, among these openings 3, one of them, designated by 3a, is intended to receive, later, an integrated circuit.

One places then, by sticking or adhering, a thin metallic strap or coating 4, for instance made of copper, on the film 1, letting or leaving uncovered the areas which are situated in the vicinity of its two lateral ends, where the perforations 2 are provided. This metallic coating 4 is intended to constitute the net or grid of the electric connectors of the module, including at 4a, the connecting element for the feeding battery of the module.

The film appears then as illustrated in FIG. 1.

The next operation consists in eliminating the metallic coating 4 where its presence is not useful, this elimination being effected by chemical way or means.

It is to be noted that, after a partial elimination, the metallic coating 4 continues to cover some of the openings 3; it forms two bands 4b extending above and across one of these openings 3, designated by 3b, and it constitutes tongues 4c, an end of each of which is free, extending above the opening 3a previously mentioned.

Figure 2:
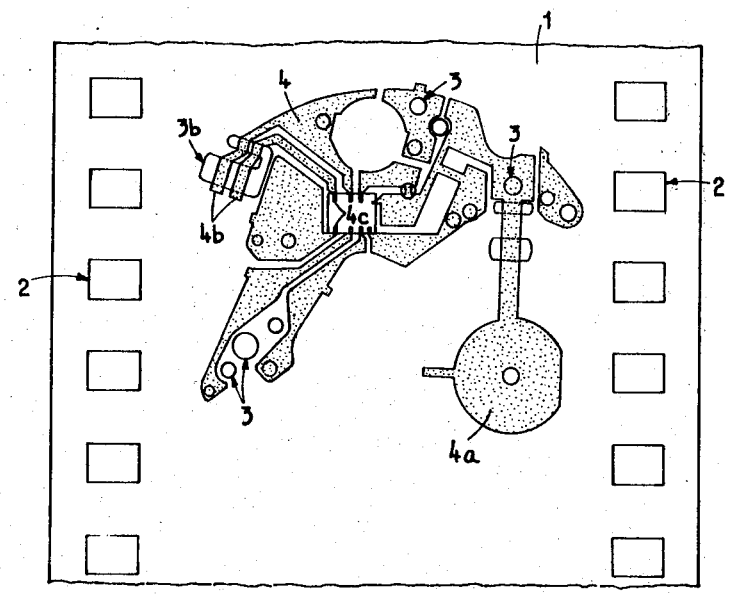
Figure 3:
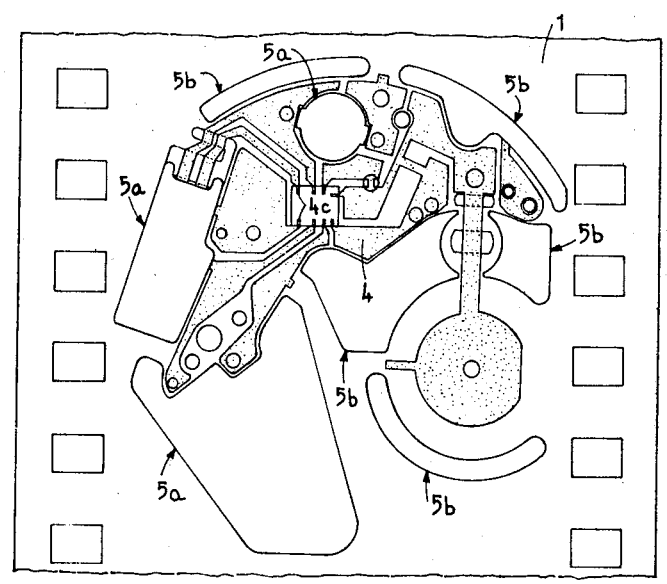

The net or grid of the conductive areas which remain has then the appearance represented in FIG. 2.

By a new operation of cutting-stamping which could, in some cases, be effected at the same time as the providing of the holes or openings 3 previously mentioned, one cuts in the film openings 5a intended to receive later components of the module, as well as openings 5b which are pre-openings of separation of the module from the film.

One places then the integrated circuit 6 which is engaged, without intermediary connectors, into the opening 3a of the film one then secures by welding, for instance by means of tin, its bumps, that is to say the pearls or beads 7 of gold or of tin which constitute the terminals of this circuit, directly to the tongues 4c of the metallic strap 4 extending above the said opening 3a. Thus, one prevents having to provide the circuit 6 with conductors welded to the said pearls serving to connect the module with the grid, as is usual. In other words, one effects the inner lead bonding (ILB) and one saves the outer lead bonding (OLB), necessary when intermediary connectors are used.

Figure 5:
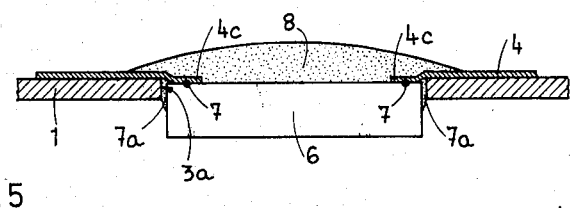
FIG. 5 is a sectional view of a detail of the module at a larger scale.

As shown in the sectional view of FIG. 5, the opening 3a provided in the film 1 for receiving the integrated circuit 6 is slightly larger than the circuit so as to prevent the drop 8 of epoxy resin, which is placed on the integrated circuit 6 and on the connecting tongues 4c for protecting them, from running under the film 1. Before the polymerization of drop 8, the drop 8 maintains itself, by capillarity at 7a, between the wall of the opening 3a and the integrated circuit 6.

It is to be noted that it is possible that the integrated circuit is not engaged into the opening 3a but is placed on the film 1 opposite or above opening 3a. The opening 3a then could be slightly smaller than the circuit 6 and provide passage to the tool used for welding the connecting tongues 4c to the circuit 6.

One then places the other components of the module in the respective openings of the film 1, that is to say the coil 9 of the motor with its armature 10, a quartz resonator 11, a variable condenser (trimmer) 12 providing the adjustment of the frequency of the resonator, and a contact blade 13. The outputs of the components 9, 11 and 12, constituted by wires 14 in the case of the coil 9 and by tongues 15 and 16 in the case of the resonator 11 and of the condenser 12, respectively, are welded to the net or grid 4 of the connectors.

Figure 6:
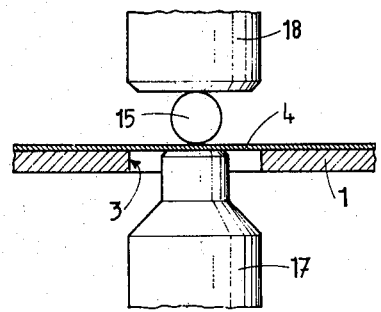
FIG. 6 represents, diagrammatically, one stage of the manufacturing of the module and of the apparatus used at this stage of the manufacturing.

It is to be noted that each point of welding is situated opposite or below one of the openings provided in the film which provides bringing welding electrodes 17 and 18 (FIG. 6) in contact respectively with the coating 4 of conductive material covering the opening 3 and with the output member, for instance one of the tongues 15 of the resonator, of the component of the module. The welding is effected by thermo-compression. As a modification, one could also proceed in the conventional way, by means of tin, for instance.

The blade 13, which is resilient and which belongs to an electric contact closing when the timepiece is reset, is welded directed to the metallic coating 4, through the two openings 3 opposite which is located one of its ends.

Figure 7:
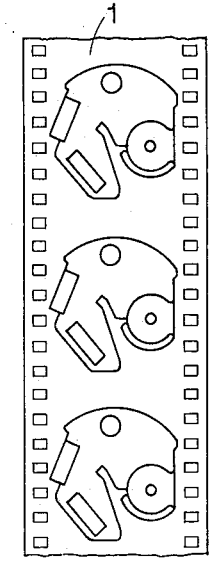
FIG. 7 is a plan view, at a smaller scale than FIGS. 1 to 4, of a portion of a flexible film at the stage of the manufacturing represented in FIG. 4.

The module is then finished, excepted that it is still attached to the film 1, which carries a series of modules as shown in FIG. 7 where a short portion of this film, provided with three modules, has been represented.

Figure 4:
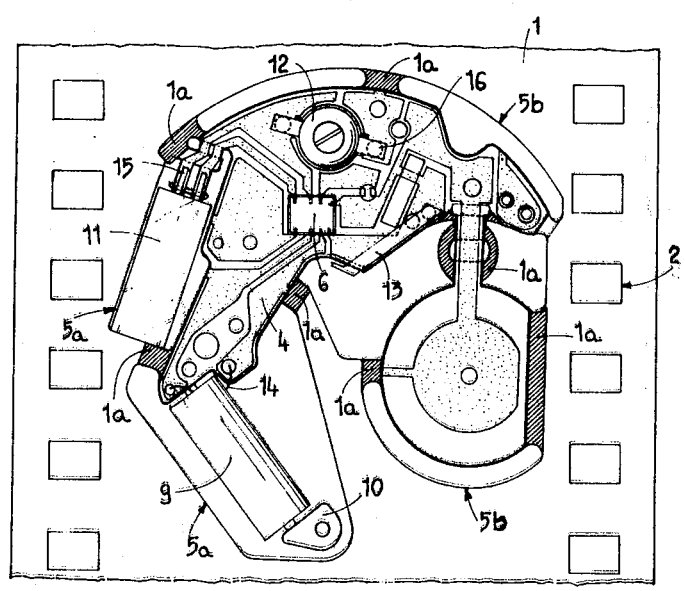

It is then sufficient to eliminate, by an operation of cutting-stamping, the bondings represented by the hatched areas 1a of FIG. 4, which still remain between the pre-openings of separation 5b previously provided for separating each module from the film 1.

Figure 8:
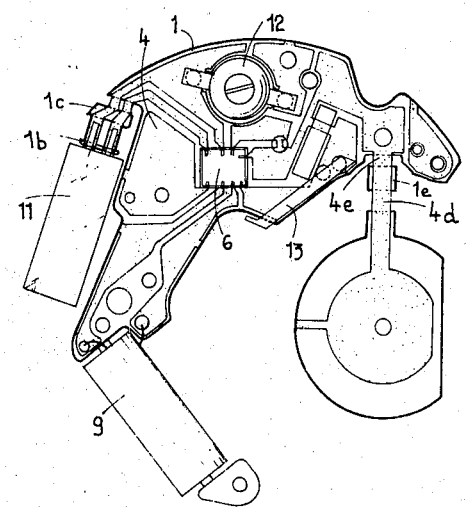
FIG. 8 is a plan view of an electronic module for a finished timepiece, obtained by carrying out the present method.

The finished module appears as represented in FIG. 8.

Figure 9:
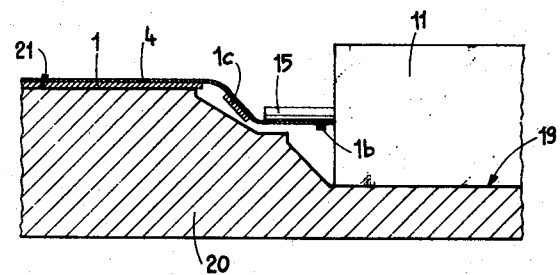
FIG. 9 is a sectional view of a detail of the module, at a larger scale.
Figure 10:
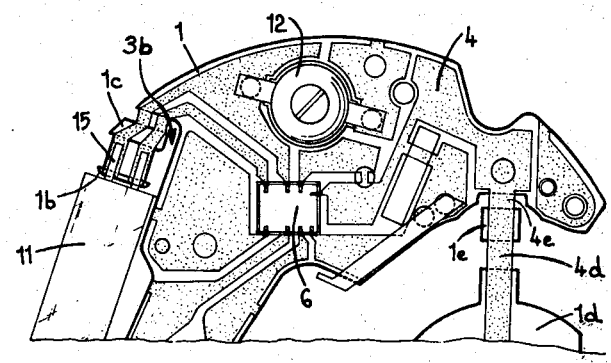
FIG. 10 is a plan view of a detail of the module, also at a larger scale.

Owing to the fact that the metallic strap 4 is flexible, is as the film 1, it is possible to bend the substrate of the module so as to adapt it to the relief of the frame of the movement of the watch on which it is mounted, that eliminates having to bend the tongues of the components of the modules as it is the case with the rigid substrates. Thus, in the example of FIG. 9, the quartz resonator 11 is placed in the bottom of a recess 9 of the base-plate 20 of the movement, on the face 21 of which is applied the film 1 of the module. One sees that the metallic strap 4 is bent so as to follow the relief of the base-plate. It is to be noted that, owing to the special shape of the aperture 3b (FIGS. 1 and 10) opposite which extend the tongues 15 of the resonator, the film 1 is provided with two portions, designated by 1b and 1c, which are separated from the rest of the film and maintained by the metallic strap 4. These two remaining portions of the film (FIG. 9) have the effect that the bending of the film can be effected only in well or predetermined points a locations thereof.

Figure 11:
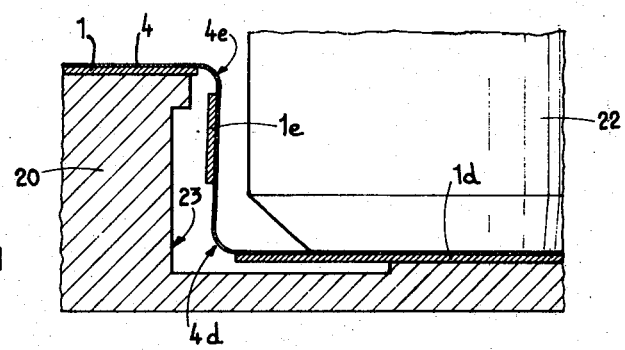
FIG. 11 is a sectional view of a detail of the module at the scale of FIG. 9.

FIG. 11 illustrates the mounting of the feeding battery 22 of the watch movement, located in a recess 23 of the base-plate 20, bearing on the metallic strap 4 bent at right angle in two places 4d and 4e, so as to be able to be adapted to the relief of the base-plate 20. As in the previous case, the film 1 is provided with two portions, separated from the rest of the film, designated by 1d and 1e, situated, the first one, under the battery 22, thus insulating it from the base-plate, and, the second one, on the portion of the metallic strap 4 situated between the elbows 4d and 4e. Owing to this arrangement, the place of the two elbows is well determined.

What I claim is:

1. An electronic watch movement for a watch having a base which is rigid and which is shaped to receive a plurality of components, the movement comprising:

a film which is electrically insulating and flexible and which is provided with a plurality of both component openings and bending openings therethrough;

a foil affixed on the film and presenting a pattern of connection leads, there being sections of said leads extending above and across said bending openings, said film including portions which are separated from the remainder of the film and which are affixed to the lead sections so that the lead sections bend at predetermined locations; and the plurality of components being located in said component openings and interconnected with said leads;

so that said film with said components interconnected thereto may be mounted on said base with said components being received by said relief and said lead sections extending above and across said bending openings being bent so that the film may bend to conform to the relief of the base.

2. The movement as claimed in claim 1 in which said predetermined locations are between said portions and said film.

* * * * *